(12) United States Patent
Mineshita

(10) Patent No.: US 9,224,915 B2
(45) Date of Patent: Dec. 29, 2015

(54) SEMICONDUCTOR LIGHT-EMITTING DEVICE, METHOD FOR PRODUCING SAME, AND DISPLAY DEVICE

(75) Inventor: Kentaro Mineshita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 71 days.

(21) Appl. No.: 13/819,830

(22) PCT Filed: Sep. 16, 2011

(86) PCT No.: PCT/JP2011/071248
§ 371 (c)(1),
(2), (4) Date: Feb. 28, 2013

(87) PCT Pub. No.: WO2012/036281
PCT Pub. Date: Mar. 22, 2012

(65) Prior Publication Data
US 2013/0161668 A1   Jun. 27, 2013

(30) Foreign Application Priority Data

Sep. 17, 2010  (JP) .................. 2010-208791
Sep. 17, 2010  (JP) .................. 2010-208792

(51) Int. Cl.
| | |
|---|---|
| *H01L 33/08* | (2010.01) |
| *H01L 33/50* | (2010.01) |
| *H01L 33/52* | (2010.01) |
| *H01L 23/00* | (2006.01) |
| *H01L 33/60* | (2010.01) |
| *H01L 33/62* | (2010.01) |
| *H01L 33/48* | (2010.01) |

(52) U.S. Cl.
CPC .............. *H01L 33/08* (2013.01); *H01L 24/48* (2013.01); *H01L 24/97* (2013.01); *H01L 33/50* (2013.01); *H01L 33/52* (2013.01); *H01L 33/60* (2013.01); *H01L 33/62* (2013.01); *H01L 33/486* (2013.01); *H01L 2224/32245* (2013.01); *H01L 2224/48091* (2013.01); *H01L 2224/48247* (2013.01); *H01L 2224/48471* (2013.01); *H01L 2224/73265* (2013.01); *H01L 2224/97* (2013.01); *H01L 2924/014* (2013.01); *H01L 2924/01004* (2013.01); *H01L 2924/0105* (2013.01); *H01L 2924/01029* (2013.01); *H01L 2924/01032* (2013.01); *H01L 2924/01033* (2013.01); *H01L 2924/01047* (2013.01); *H01L 2924/01079* (2013.01); *H01L 2924/01082* (2013.01); *H01L 2924/01088* (2013.01); *H01L 2924/01322* (2013.01)

(58) Field of Classification Search
None
See application file for complete search history.

(56) References Cited

U.S. PATENT DOCUMENTS

| | | | |
|---|---|---|---|
| 7,190,057 B2 | 3/2007 | Seki et al. | |
| 2004/0232534 A1* | 11/2004 | Seki et al. | ............ 257/678 |
| 2009/0039486 A1* | 2/2009 | Shimazaki et al. | ........ 257/676 |

(Continued)

FOREIGN PATENT DOCUMENTS

| | | |
|---|---|---|
| JP | 9-92888 | 4/1997 |
| JP | 11-307820 | 11/1999 |

(Continued)

*Primary Examiner* — Khaja Ahmad
(74) *Attorney, Agent, or Firm* — Hamre, Schumann, Mueller & Larson, P.C.

(57) ABSTRACT

A semiconductor light-emitting device (101) includes an LED chip (4), a lead (1) having a main surface (11) on which the LED chip (4) is mounted, and a resin package (5) covering the LED chip (4). The main surface (11) is roughened, and the main surface (11) is held in contact with the resin package (5). These configurations contribute to the downsizing of the semiconductor light-emitting device (101).

22 Claims, 15 Drawing Sheets

(56) References Cited

U.S. PATENT DOCUMENTS

2010/0163920 A1* 7/2010 Itai .................................. 257/99
2010/0258922 A1* 10/2010 Nakamura et al. ............ 257/676

FOREIGN PATENT DOCUMENTS

| | | |
|---|---|---|
| JP | 2001-196641 | 7/2001 |
| JP | 2002-83917 | 3/2002 |
| JP | 2003-31854 | 1/2003 |
| JP | 2004-349497 | 12/2004 |
| JP | 2006-140207 | 6/2006 |
| JP | 2007 142200 | 6/2007 |
| JP | 2007-234629 | 9/2007 |
| JP | 2007-335734 | 12/2007 |
| WO | WO 2008/153043 | 12/2008 |

* cited by examiner

SEMICONDUCTOR LIGHT-EMITTING DEVICE, METHOD FOR PRODUCING SAME, AND DISPLAY DEVICE

TECHNICAL FIELD

The present invention relates to a semiconductor light-emitting device including semiconductor light-emitting elements, while also relating to a manufacturing Method thereof and a display device such as a 7-segment display and a dot matrix display.

BACKGROUND ART

FIG. 17 depicts a conventional semiconductor light-emitting device (see e.g. Patent document 1). The semiconductor light-emitting device 901 shown in FIG. 17 includes an LED chip 912 bonded on a substrate 910. The LED chip 912 and a wire 913 are encapsulated in a resin package 914.

In recent years, there has been a growing demand for reduction in size, for example with respect to mobile phones. Accordingly, the semiconductor light-emitting device 901 is required to be made smaller. On the other hand, the resin package 914 has to have a size that can properly cover the LED chip 912 and the wire 913. The substrate 910 includes orifices 911 formed on the respective end portions thereof, for electrical connection between the front and back surfaces. In case that the resin package 914 overlaps the orifice 911, the resin material to be formed into the resin package 914 leads through the orifice 911. Accordingly, it is inevitable that the substrate 910 be larger than the resin package 914. Such a structure impedes the semiconductor light-emitting device 901 from being made smaller in size.

Further, in the case where the semiconductor light-emitting device 901 is made in a smaller size, the bonding area between the resin package 914 and the counterpart (substrate 910 in the case of semiconductor light-emitting device 901) is also made smaller. Accordingly, the substrate 910 becomes more prone to separate from the resin package 914. This is another obstacle that impedes the reduction in size of the semiconductor light-emitting device 901.

FIG. 18 depicts an existing display device (see e.g. Patent document 2). The display device 902 shown in FIG. 18 is what is known as a 7-segment type display device, in which seven LED chips 922 are bonded on a substrate 921. The LED chips 922 and wires 923 are respectively placed in seven openings 926 formed on a reflector 925. The openings 926 are each filled with light-transmissive resin 924 that covers the LED chip 922.

In the manufacturing process of the display device 902, the resin material has to be injected into the openings 926. However, this process requires considerable time and labor, and hence constitutes a bottleneck from the viewpoint of production efficiency of the display device 902. Further, the openings 926 have to be made in a size that allows the resin material to be injected thereinto, for example a size that prevents interference with an injection nozzle. Therefore, it has been difficult to reduce the size of the display device 902, and to improve the definition thereof.

CITATION LIST

Patent Literature

Patent document 1: JP-A-2001-196641
Patent document 2: JP-A-2003-031854

SUMMARY OF INVENTION

Technical Problem

The present invention has been proposed under the foregoing situation. It is therefore an object of the present invention to provide a semiconductor light-emitting device that can be manufactured in a smaller size, and also a method of manufacturing such a semiconductor light-emitting device. Further, another object of the present invention is to provide a display device that can be manufactured in a smaller size and at a lower cost.

Solution to Problem

A first aspect of the present invention provides a semiconductor light-emitting device including a semiconductor light-emitting element, a first lead including a first main surface on which the semiconductor light-emitting element is mounted, and a resin package covering the semiconductor light-emitting element. The first main surface is roughened, and the first main surface and the resin package are held in contact with each other.

In a preferred embodiment of the present invention, the first main surface may include a plated layer, and the plated layer may be formed with a rough surface.

In a preferred embodiment of the present invention, the plated layer may be an Ag-plated layer.

In a preferred embodiment of the present invention, the first lead may include a first mounting terminal face located on a side opposite to the first main surface and exposed from the resin package.

In a preferred embodiment of the present invention, the first lead may include a plurality of first side faces extending in a direction in which the first main surface and the first mounting terminal face are separated from each other, and at least a part of each of the first side faces may be covered with the resin package.

In a preferred embodiment of the present invention, the first lead may include a first drawn-out portion extending from the first side face and including a leading end face exposed from the resin package.

In a preferred embodiment of the present invention, the first lead may include a first buried surface oriented in the same direction as the first mounting terminal face and covered with the resin package.

In a preferred embodiment of the present invention, the semiconductor light-emitting device may further include a wire including an end portion connected to the semiconductor light-emitting element, and a second lead including a second main surface to which the other end portion of the wire is connected. The second main surface may be roughened.

In a preferred embodiment of the present invention, the second main surface may include a plated layer, and the plated layer may be formed with a rough surface.

In a preferred embodiment of the present invention, the second lead may include a second mounting terminal face located on a side opposite to the second main surface and exposed from the resin package.

In a preferred embodiment of the present invention, the second lead may include a plurality of second side faces extending in a direction in which the second main surface and the second mounting terminal face are separated from each other, and at least a part of each of the second side faces may be covered with the resin package.

In a preferred embodiment of the present invention, the second lead may include a second drawn-out portion extending from the second side face and including a leading end face exposed from the resin package.

In a preferred embodiment of the present invention, the second lead may include a second buried surface oriented in the same direction as the second mounting terminal face and covered with the resin package.

In a preferred embodiment of the present invention, the resin package may include a fluorescent material that emits, upon being excited by light from the semiconductor light-emitting element, light of a wavelength different from a wavelength of the light from the semiconductor light-emitting element.

In a preferred embodiment of the present invention, the resin package may include a transparent portion that covers the semiconductor light-emitting element and transmits light from the element, and may also include an opaque portion located on the side opposite to the direction in which the first main surface is oriented to the transparent portion.

In a preferred embodiment of the present invention, the opaque portion may be formed of a white resin.

In a preferred embodiment of the present invention, the transparent portion may include a fluorescent material that emits, upon being excited by light from the semiconductor light-emitting element, light of a wavelength different from a wavelength of the light from the semiconductor light-emitting element.

A second aspect of the present invention provides a method of manufacturing a semiconductor light-emitting device. The method comprises: preparing a lead frame including a first lead and a second lead, where the first lead includes a first main surface and the second lead includes a second main surface oriented in the same direction as the first main surface; roughening at least a part of each of the first main surface and the second main surface; mounting a semiconductor light-emitting element on the first main surface; and forming a resin package covering the semiconductor light-emitting element and held in contact with the first main surface and the second main surface.

In a preferred embodiment of the present invention, the roughening of the surfaces may include plating the first main surface and the second main surface.

In a preferred embodiment of the present invention, the roughening of the surfaces may include shot-blasting the first main surface and the second main surface.

The foregoing arrangement contributes to the enhancing of the bonding strength between the first and the second main surface and the resin package, because of the rough finish of the surfaces. Thus, the first and the second main surfaces are prevented from separating from the resin package, which allows the semiconductor light-emitting device to be made smaller in size.

A third aspect of the present invention provides a display device comprising: a semiconductor light-emitting device according to the first aspect of the present invention; a base material including a mounting face on which the semiconductor light-emitting device is mounted; and a reflector including at least one pair of reflecting surfaces opposing each other with the semiconductor light-emitting device therebetween.

In a preferred embodiment of the present invention, the reflecting surfaces may be inclined so as to increase a distance therebetween as proceeding away from the mounting face in a normal direction of the mounting face.

In a preferred embodiment of the present invention, the reflector may be of a plate shape stacked on the base material, and may include seven linear openings arranged in a numeral 8, where the openings each are formed to penetrate through the reflector in a thickness direction, the openings may each include one semiconductor light-emitting device, and each of the openings may include an inner surface constituting the reflecting surface. In this embodiment, a 7-segment type display device is provided.

In a preferred embodiment of the present invention, the reflector may be of a plate shape stacked on the base material, and may include a plurality of openings arranged in a matrix pattern, where the openings each are formed to penetrate through the reflector in a thickness direction, the openings may each include one semiconductor light-emitting device, and each of the openings may include an inner surface constituting the reflecting surface. In this embodiment, a dot matrix type display device is provided.

In a preferred embodiment of the present invention, the reflector may be formed of a white resin.

In a preferred embodiment of the present invention, the base material may be a printed circuit board.

The foregoing configuration eliminates the need to fill the space between the pair of reflecting surfaces with a light-transmissive resin, after the semiconductor light-emitting device is mounted. Accordingly, the manufacturing process of the display device can be simplified and the manufacturing cost thereof can be reduced. Further, it is not necessary to connect a wire to the semiconductor light-emitting device. Therefore, there is no need to insert a capillary for bonding a wire in the space between the pair of reflecting surfaces. In addition, it is not necessary to insert a device, such as a nozzle, for filling the space between the pair of reflecting surfaces with a light-transmissive resin. Thus, the space between the pair of reflecting surfaces can be small as long as it accommodates the semiconductor light-emitting device. Consequently, the display device can be manufactured in a smaller size.

The above and other features and advantages of the present invention will become more apparent through detailed description given below with reference to the accompanying drawings.

DESCRIPTION OF EMBODIMENTS

Preferred embodiments of the present invention will be described below with reference to the accompanying drawings.

Figure 1:
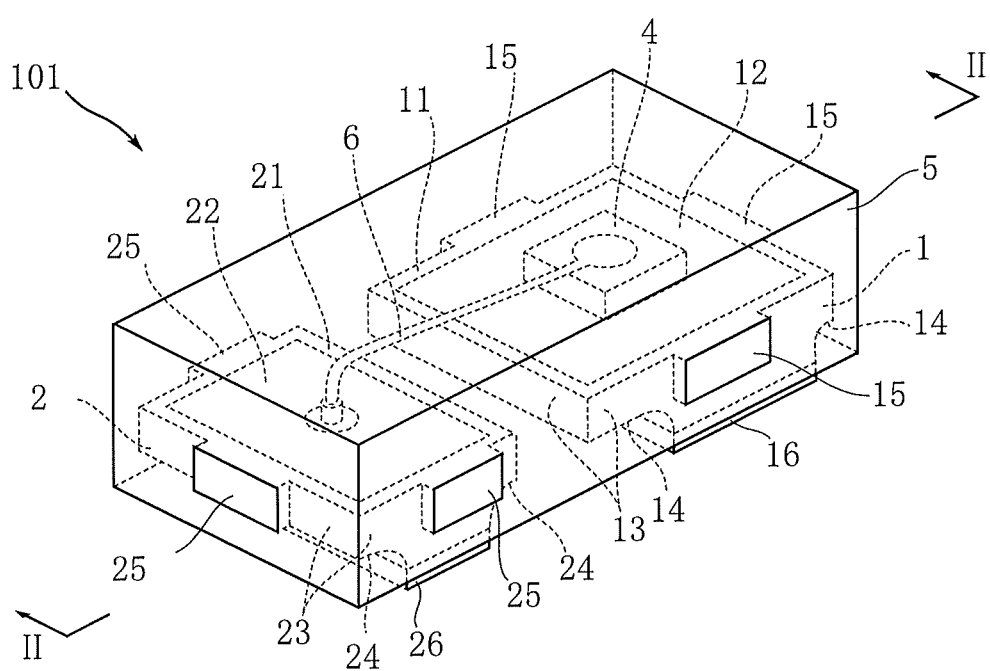
FIG. 1 is a perspective view showing an example of a semiconductor light-emitting device according to the present invention.
Figure 2:
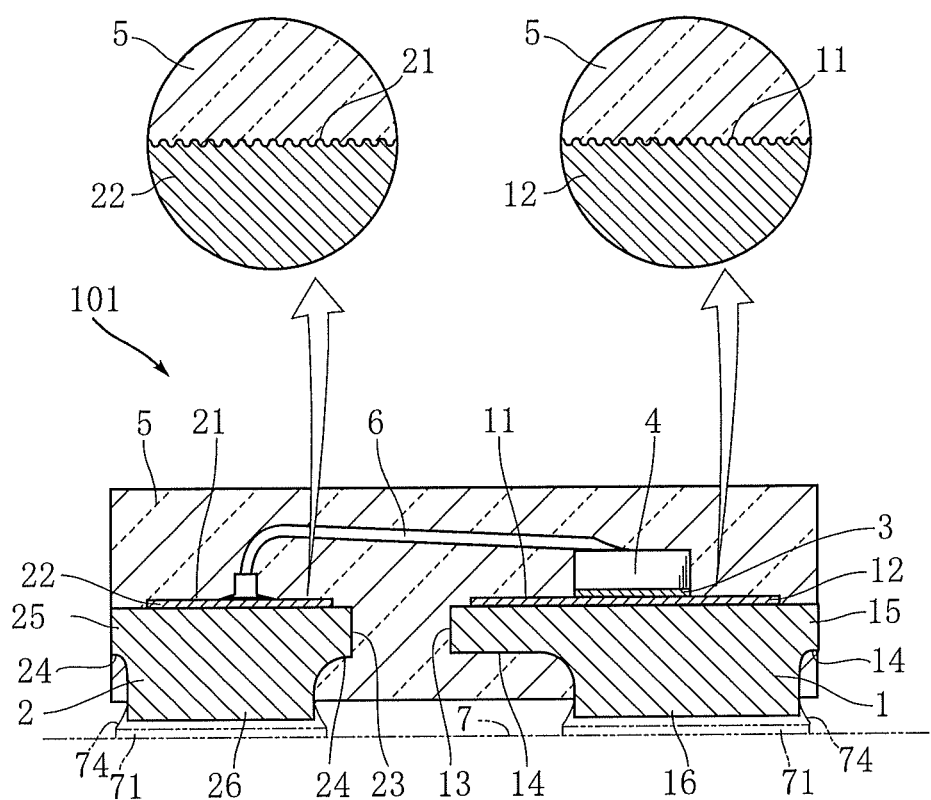
FIG. 2 is a cross-sectional view taken along a line II-II in FIG. 1.
Figure 3:
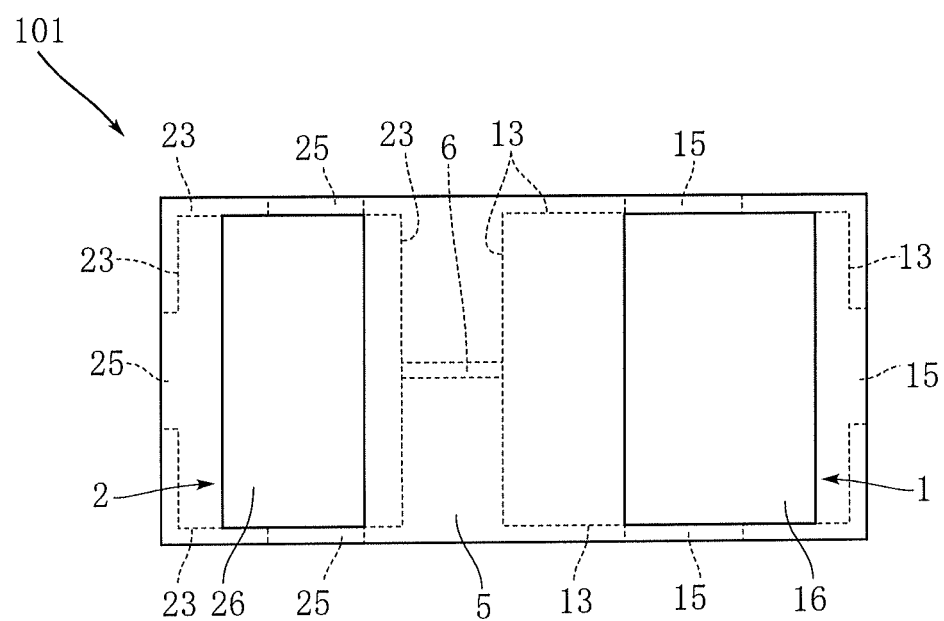
FIG. 3 is a bottom view of the semiconductor light-emitting device shown in FIG. 1.

FIGS. 1 to 3 depict an example of a semiconductor light-emitting device according to an embodiment of the present invention. The semiconductor light-emitting device 101 according to this embodiment includes a pair of leads 1, 2, a metal joint layer 3, an LED chip 4, and a resin package 5. In FIG. 1, the metal joint layer 3 is not shown for the sake of convenience. The semiconductor light-emitting device 101 is configured as a small and thin device, having dimensions of approximately 0.6 mm in length, 0.3 mm in width, and 0.2 mm in thickness.

The pair of leads 1, 2 serve to support the LED chip 4 and supply power thereto. The leads 1, 2 are formed of Cu or an alloy thereof, in a thickness of slightly less than 0.1 mm. The lead 1 includes a main surface 11, four side faces 13, two buried surfaces 14, three drawn-out portions 15, and a mounting terminal 16. The lead 2 includes a main surface 21, four side faces 23, two buried surfaces 24, three drawn-out portions 25, and a mounting terminal 26.

The main surface 11 is a portion on which the LED chip 4 is to be die-bonded, and has dimensions of approximately 0.27 mm×0.24 mm. The main surface 21 is a portion on which a wire 6 is to be bonded, and has dimensions of approximately 0.19 mm×0.24 mm. The main surface 11 and the main surface 21 are both covered with the resin package 5.

As shown in FIG. 2, the main surface 11 is plated with silver, and an Ag-plated layer 12 is formed thereon. The surface of the Ag-plated layer 12 is roughened and has higher surface roughness than the remaining portions of the lead 1. The main surface 21 is also plated with silver, and an Ag-plated layer 22 is formed thereon. The surface of the Ag-plated layer 22 is roughened and has higher surface roughness than the remaining portions of the lead 2. Since the Ag-plated layers 12, 22 have a rough surface, the respective portions of the main surfaces 11, 21 covered with the Ag-plated layers 12, 22 present a rough surface. Examples of methods to roughen the surface of the Ag-plated layers 12, 22 include selecting a plating process that provides a rough surface, and performing shot-blasting after the plating. The surface roughness of the Ag-plated layers 12, 22 may be approximately 1 μm. For example, the surfaces may have an arithmetic surface roughness Ra of 0.08 to 0.20. The Ag-plated layer 12 has dimensions of approximately 0.25 mm×0.21 mm, and the Ag-plated layer 22 has dimensions of approximately 0.13 mm×0.2 mm.

The mounting terminals 16, 26 are to be used for surface-mounting the semiconductor light-emitting device 101 and, as shown in FIG. 2, formed of the respective portions of the leads 1, 2 extending in a direction opposite to the LED chip 4 and exposed from the resin package 5. In this embodiment, the mounting terminals 16, 26 have dimensions of approximately 0.19 mm×0.27 mm.

The side faces 13, 23 are faces extending in a direction in which the main surfaces 11, 21 and the mounting terminals 16, 26 are separated from each other, respectively. In this embodiment, nearly the entirety of the side faces 13, 23 is covered with the resin package 5.

The drawn-out portions 15, 25 extend from the side faces 13, 23 and each have an end face exposed from the resin package 5. The drawn-out portions 15, 25 are formed, for example, by cutting a portion connecting between the pair of leads 1, 2 and a frame portion of a lead frame.

The buried surfaces 14, 24 correspond to the surfaces of partially scraped portions of the leads 1, 2, and oriented opposite to the main surface 11, 21. In this embodiment, the leads 1, 2 each include two buried surfaces 14, 24. The base portion of each of the buried surfaces 14, 24 is formed in a curved shape.

The metal joint layer 3 serves to couple the LED chip 4 and the Ag-plated layer 12, and is composed of an alloy of Au and one of Sn, Si, and Ge. The metal joint layer 3 has a thickness of, for example, 1 μm or less.

The LED chip 4 is the light source of the semiconductor light-emitting device 101, and has a layered structure including, for example, an n-type semiconductor layer and a p-type semiconductor layer, and an active layer interleaved therebetween. The LED chip 4 is, for example, capable of emitting blue light in the case of being constituted of an InGaN-based semiconductor, and has a size of approximately 0.1 mm square and a thickness of approximately 50 μm. The upper face of the LED chip 4 is connected to the main surface 21 through the wire 6. Here, the LED chip 4 may be constituted of an AlGaNInP-based semiconductor, for example.

The resin package 5 serves to protect the LED chip 4 and the wire 6. The resin package 5 is formed of a resin that transmits the light from the LED chip 4, for example an epoxy resin. In the case where a fluorescent material that emits yellow light upon being excited by blue light is mixed in the resin package 5, the semiconductor light-emitting device 101 becomes capable of emitting white light. In this embodiment, the resin package 5 has dimensions of approximately 0.6 mm×0.3 mm in a plan view, and a thickness of slightly less than 0.2 mm.

Referring now to FIGS. 4 to 8, an example of the manufacturing method of the semiconductor light-emitting device 101 will be described hereunder.

Figure 4:
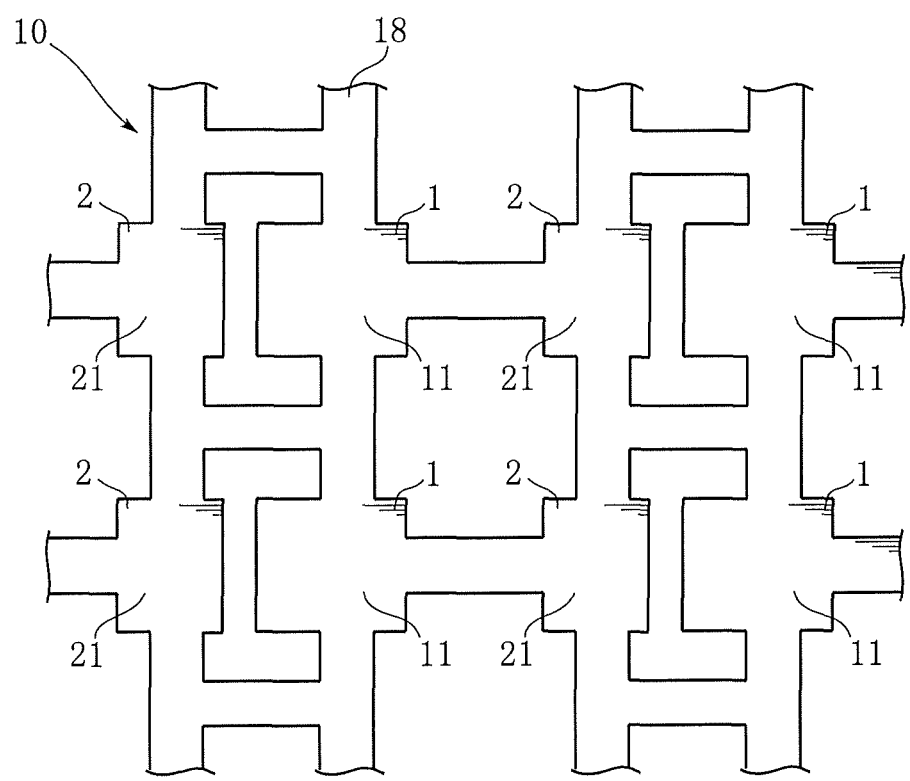
FIG. 4 is a fragmentary plan view of a lead frame employed in an example of a manufacturing process of the semiconductor light-emitting device shown in FIG. 1.

First, a lead frame 10 as shown in FIG. 4 is prepared. The lead frame 10 includes a plurality of leads 1, 2 and frame portions 18 connecting between the leads 1, 2. The lead frame is formed of, for example, Cu or an alloy thereof in thickness of slightly less than 0.1 mm. The lead frame 10 may be formed by punching a metal plate of, for example, Cu or an alloy thereof.

Figure 5:
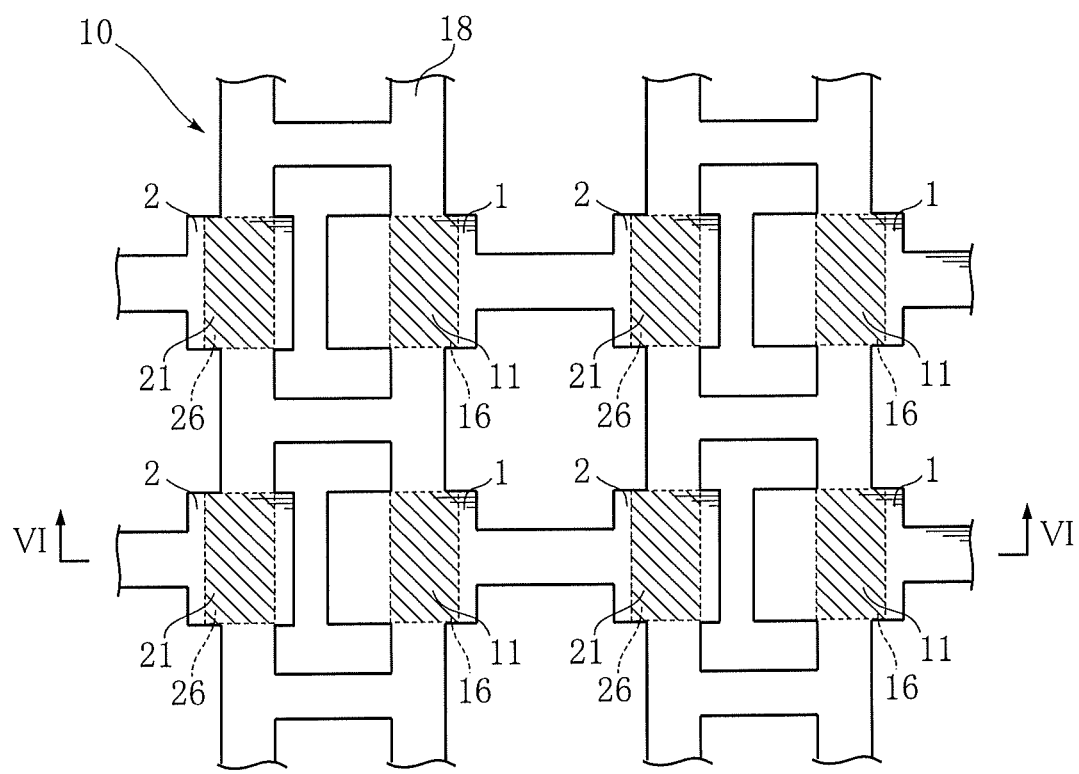
FIG. 5 is a fragmentary plan view of the lead frame subjected to etching in an example of a manufacturing process of the semiconductor light-emitting device shown in FIG. 1.
Figure 6:
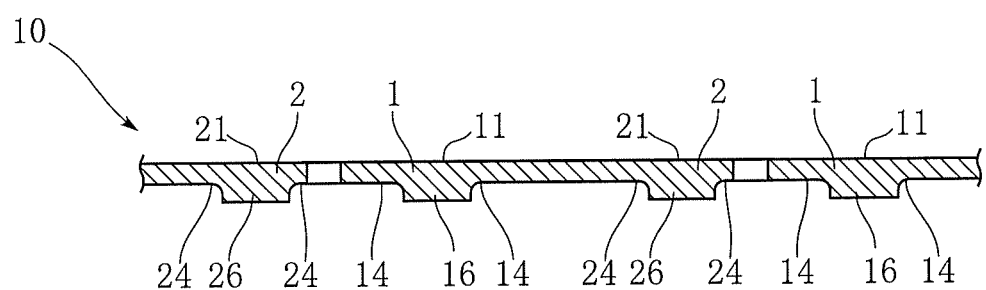
FIG. 6 is a fragmentary cross-sectional view taken along a line VI-VI in FIG. 5.

Then an etching process is applied to the lead frame 10. The etching is applied to a region of the lead frame 10 opposite to the main surface 11, 21. The etching reduces the thickness of a part of the lead frame 10, as shown in FIGS. 5 and 6, so that a plurality of the mounting terminals 16, 26 and a plurality of the buried surfaces 14, 24 are formed. Here, hatched portions in FIG. 5 correspond to the mounting terminals 16, 26 in a plan view.

Figure 7:
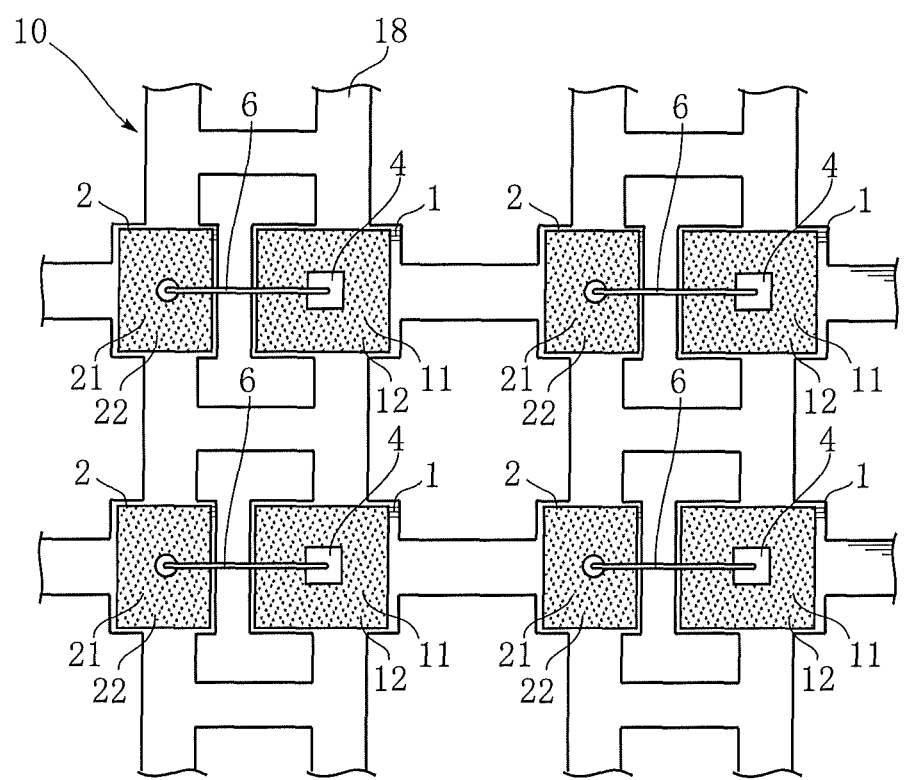
FIG. 7 is a fragmentary plan view of the lead frame with LED chips mounted thereon, in an example of a manufacturing process of the semiconductor light-emitting device shown in FIG. 1.

Proceeding to FIG. 7, the lead frame 10 is plated. As a result, the Ag-plated layers 12, 22 are formed on the lead frame 10. For this plating process, it is preferable to select a method that is more likely to form a relative rough surface on the Ag-plated layers 12, 22, so that the Ag-plated layers 12, 22 obtain a surface roughness of approximately 1 μm. Alternatively, a shot-blasting process may be applied to the Ag-plated layers 12, 22, to thereby roughen the surfaces of the Ag-plated layers 12, 22.

Then the LED chip 4 is mounted on the main surface 11. To mount the LED chip 4, the metal joint layer 3 is employed. To couple the LED chip 4 to the main surface 11 with the metal joint layer 3, for example the LED chip 4 is pressed against the Ag-plated layer 12 with the metal joint layer 3 therebetween and the atmospheric temperature is raised to 200 to 350° C., and then the LED chip 4 is ultrasonically caused to vibrate. Through such a process, the metal joint layer 3 forms a eutectic with both of the Ag-plated layer 12 and the LED chip 4. Therefore, the LED chip 4 is firmly fixed to the main surface 11. Then the LED chip 4 is connected to the lead 2 with the wire 6.

Figure 8:
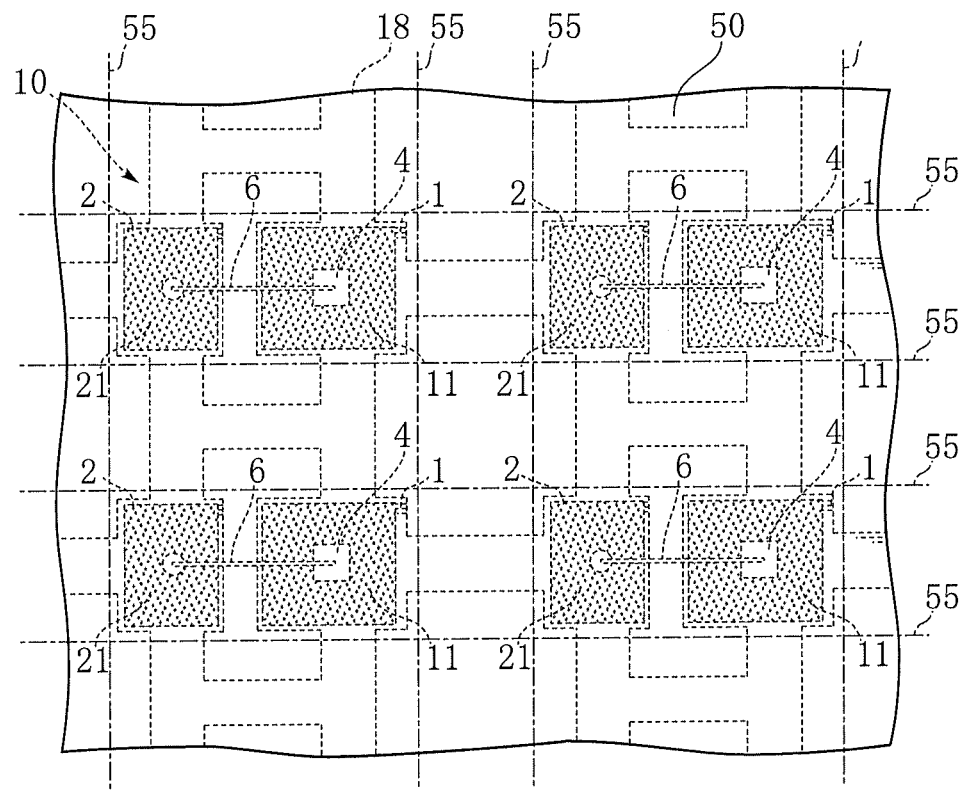
FIG. 8 is a fragmentary plan view of the lead frame encapsulated in a resin package, in an example of a manufacturing process of the semiconductor light-emitting device shown in FIG. 1.

Then as shown in FIG. 8, the resin package 50 is formed. To form the resin package 50, a die molding process is employed using, for example, a transparent epoxy resin material, or a mixture of the transparent epoxy resin material and a fluorescent material. The resin package 50 covers nearly the entirety of the lead frame 10, all of the LED chips 4 and wires 6. Thereafter, the lead frame 10 is cut along cutting lines 55. Through the process described thus far, the semiconductor light-emitting device 101 shown in FIGS. 1 to 3 can be obtained.

The semiconductor light-emitting device 101 provides the following advantageous effects.

According to this embodiment, the resin package 5 is in contact with the main surfaces 11, 21, which are rough surfaces. Such a configuration increases the adhesion strength between the resin package 5 and the leads 1, 2. Therefore, the leads 1, 2 can be prevented from separating from the resin package 5, which allows the semiconductor light-emitting device 101 to be manufactured in a smaller size.

The resin package 5 covers the side faces 13, 23 of the leads 1, 2. Accordingly, the resin package 5 and the leads 1, 2 are coupled with each other via a larger joint area. In addition, the leads 1, 2 are held by the resin package 5 via the side faces 13, 23. Such a configuration further assures the prevention of the separation of the leads 1, 2 from the resin package 5.

Further, the resin package 5 also holds the leads 1, 2 in the thickness direction, via the portions of the resin package 5 in contact with the buried surfaces 14, 24 and the main surfaces 11, 21. Such a configuration is quite effective to prevent the leads 1, 2 from separating from the resin package 5. In addition, the drawn-out portions 15, 25 extending so as to expose the leading end face from the resin package 5 even further assures the prevention of the separation of the leads 1, 2.

The semiconductor light-emitting device 101 according to this embodiment is free from orifices about which some measures have to be taken to prevent leakage of the resin material in the forming process of the resin package 5. Therefore, the resin package 5 can be formed in substantially the same size as the overall semiconductor light-emitting device 101. In other words, the semiconductor light-emitting device 101 can be manufactured in a size substantially equal to the resin package 5 having the minimum necessary size to properly protect the LED chip 4 and the wire 6. Consequently, the reduction in size of the semiconductor light-emitting device 101 can be achieved.

The resin package 5 surrounding the mounting terminals 16, 26 is formed of a material that has very low wettability with respect to solder. Accordingly, in the case of mounting the semiconductor light-emitting device 101 on a printed circuit board 7 having an interconnect pattern 71 formed thereon as shown in FIG. 2, solder 74 is blocked by the resin package 5 and can barely protrude from the mounting terminals 16, 26. Therefore, when a plurality of the semiconductor light-emitting devices 101 are mounted on the same printed circuit board 7, the solder 74 of adjacent devices is kept from interfering with each other. Consequently, the semiconductor light-emitting devices 101 can be mounted in higher density.

The Ag-plated layers 12, 22 each constitute a reflecting surface having a high reflectance. Accordingly, the light emitted from the LED chip 4 toward the main surfaces 11, 21 is reflected, being barely absorbed. Such a configuration contributes to increasing the luminance of the semiconductor light-emitting device 101. In the case where the LED chip 4 emits blue light in particular, the Ag-plated layers 12, 22 are suitable for reflecting the blue light. In addition, heat generated when the LED chip 4 emits the light can be efficiently released from the main surface 11 toward the printed circuit board 7, through the mounting terminal 16. This is advantageous for increasing the luminance of the semiconductor light-emitting device 101 by supplying higher power.

The metal joint layer 3 enables the LED chip 4 and the Ag-plated layer 12 to be coupled with each other in a eutectic state. As a result, the LED chip 4 can be firmly fixed to the main surface 11. Therefore, the LED chip 4 formed in a significantly small size can be properly fixed. Further, since the LED chip 4 can be bonded with a sufficient adhesion strength, it is not necessary to apply a large amount of the metal joint layer 3 that protrudes from the around the LED chip 4. Therefore, the light from the LED chip 4 can be prevented from being absorbed by the metal joint layer 3. Such a configuration allows, therefore, the luminance of the semiconductor light-emitting device 101 to be further upgraded.

Figure 9:
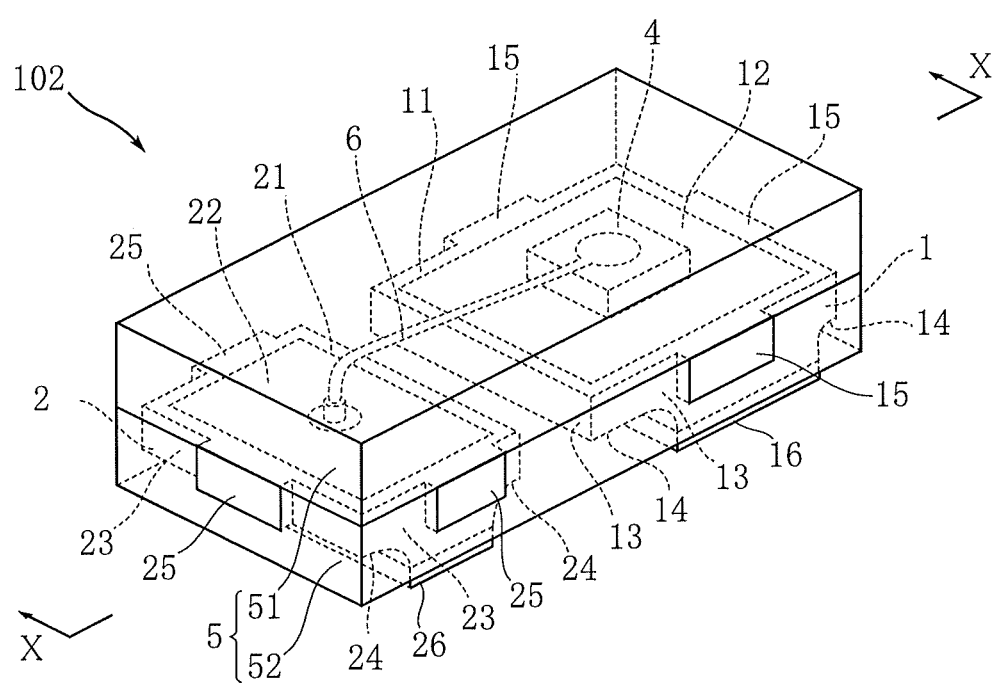
FIG. 9 is a perspective view showing another example of a semiconductor light-emitting device according to the present invention.
Figure 10:
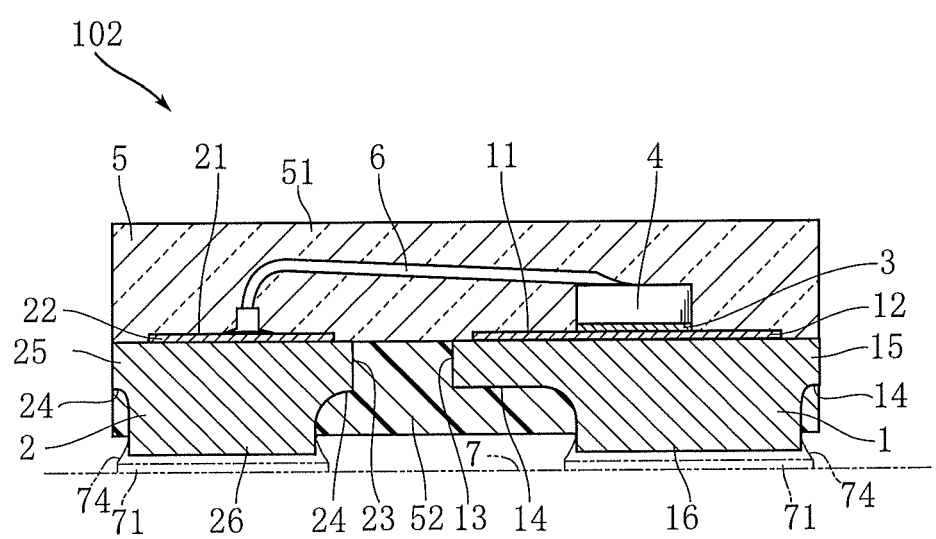
FIG. 10 is a cross-sectional view taken along a line X-X in FIG. 9.
Figure 11:
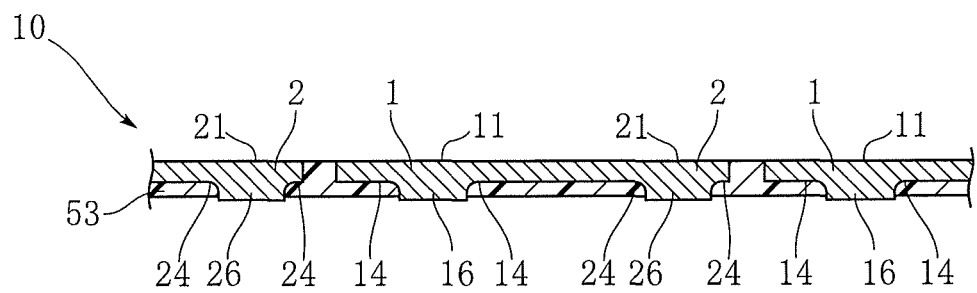
FIG. 11 is a fragmentary cross-sectional view showing an opaque portion formed in an example of a manufacturing process of the semiconductor light-emitting device shown in FIG. 9.

FIGS. 9 to 11 depict another embodiment of the present invention. In these drawings, the constituents same as or similar to those of the foregoing embodiment are given the same numeral.

FIGS. 9 and 10 depict another example of the semiconductor light-emitting device according to the present invention. The semiconductor light-emitting device 102 according to this embodiment is different from the semiconductor light-emitting device 101 in the configuration of the resin package 5.

In this embodiment, the resin package 5 includes a transparent portion 51 and an opaque portion 52. The transparent portion 51 is formed of a material that transmits the light from the LED chip 4, for example a transparent epoxy resin, or a mixture of the transparent epoxy resin and a fluorescent material. The transparent portion 51 covers the LED chip 4, and is in contact with the main surfaces 11, 21. The opaque portion 52 is formed of a material that does not transmit the light from the LED chip 4, such as a white resin. The opaque portion 52 is located lower than the main surfaces 11, 21, and covers the side faces 13, 23 and the buried surfaces 14, 24 of the leads 1, 2.

In the manufacturing method of the semiconductor light-emitting device 102, the opaque portion 52 is formed on the lead frame 10 as shown in FIG. 11, for example with a white resin, after the lead frame 10 is prepared as shown in FIG. 4.

The opaque portion 52 may be formed after the Ag-plated layers 12, 22 are formed. The above is followed by the mounting of the LED chip 4, the bonding of the wire 6, and the forming of the transparent portion similar to the resin package 50 shown in FIG. 8, and then the lead frame 10 is cut. The semiconductor light-emitting device 102 can thus be obtained.

In the semiconductor light-emitting device 102 thus configured, the portion between the leads 1, 2 and the periphery thereof are filled with the opaque portion 52. Accordingly, the light from the LED chip 4 can be prevented from unduly leaking to the side of the mounting terminals 16, 26. In addition, the opaque portion 52 formed of a white resin has a relatively high reflectance. Therefore, the luminance of the semiconductor light-emitting device 102 can be increased.

The semiconductor light-emitting device according to the present invention is not limited to the foregoing embodiments. Specific configurations of the constituents of the semiconductor light-emitting device according to the present invention may be modified in various manners.

Figure 12:
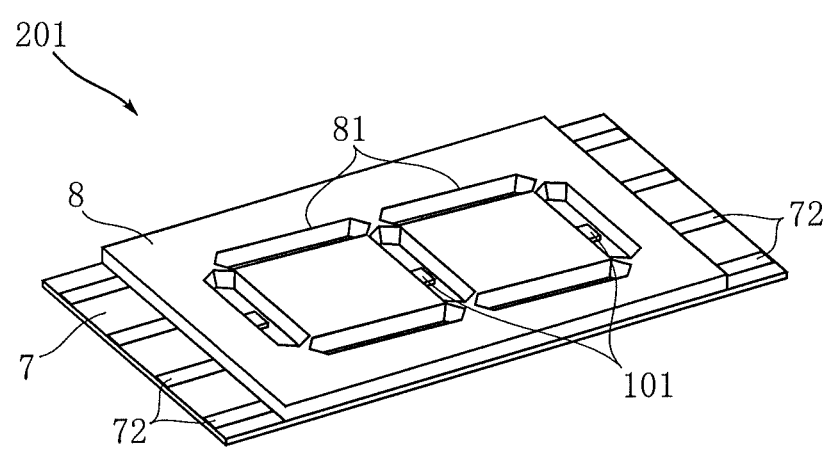
FIG. 12 is a perspective view showing an example of a display device including the semiconductor light-emitting device according to the present invention.
Figure 13:
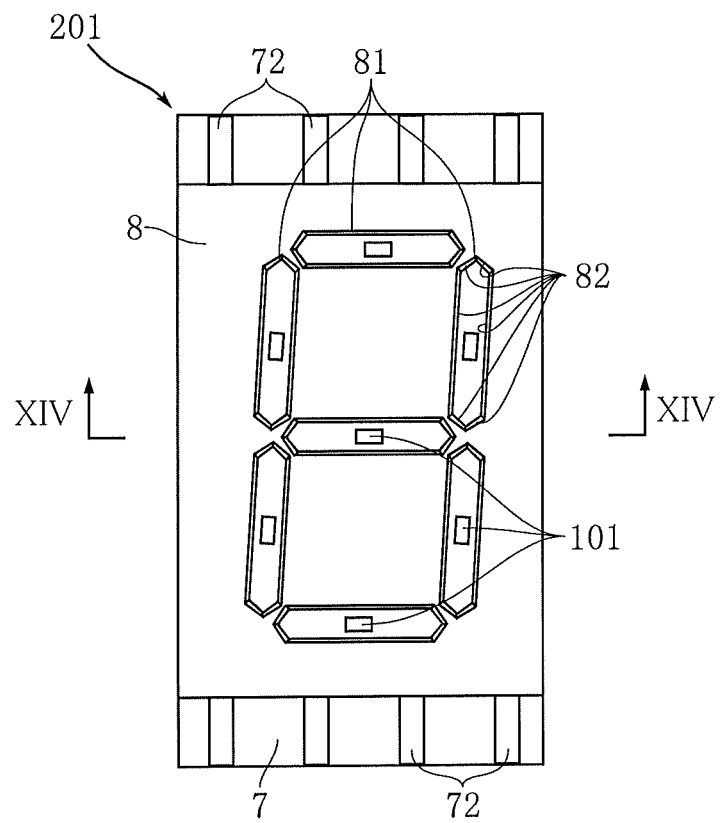
FIG. 13 is a plan view showing the display device shown in FIG. 12.
Figure 14:
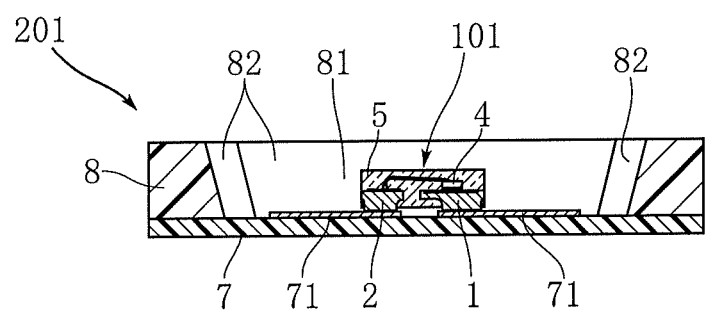
FIG. 14 is a cross-sectional view taken along a line XIV-XIV in FIG. 13.

FIGS. 12 to 14 depict an example of a display device according to the present invention. The display device 201 according to this embodiment includes the printed circuit board 7, seven semiconductor light-emitting devices 101, and a reflector 8. The display device 201 is constituted as what is known as a 7-segment type display device capable of displaying numerals and alphabets.

The printed circuit board 7 includes, for example, a resin layer and a patterned metal layer stacked thereon, and serves as the base of the display device 201. In this embodiment, the printed circuit board 7 is formed in a slender rectangular shape. The interconnect pattern 71 and a plurality of terminals 72 are provided on the printed circuit board 7. The terminals 72 are used for incorporating the display device 201 in an electronic apparatus and the like. The interconnect pattern 71 serves for electrical connection between the terminals 72 and the semiconductor light-emitting devices 101.

The semiconductor light-emitting device 101 is the light source of the display device 201. In this embodiment, seven pieces of the semiconductor light-emitting device 101 are employed, and mounted on the printed circuit board 7.

The reflector 8 has a slender rectangular plate shape and is formed of, for example, a white resin in this embodiment. The reflector 8 includes seven openings 81. The openings 81 each have a slender hexagonal shape in a plan view. As shown in FIG. 13, the seven openings 81 are arranged so as to form a numeral of 8 as a whole.

The openings 81 accommodate one each of the semiconductor light-emitting device 101. The inner wall of each opening 81 serves as a reflecting surface 82. In this embodiment, each of the openings 81 includes six reflecting surfaces 82. These reflecting surfaces 82 constitute three pairs of reflecting surfaces 82, each pair opposing each other across the semiconductor light-emitting device 101. As shown in FIG. 14, each pair of the reflecting surfaces 82 are inclined so as to increase the distance therebetween toward a position more distant from the mounting face in a direction of the normal of the mounting face, on which the semiconductor light-emitting device 101 is mounted.

The display device 201 provides the following advantageous effects.

The configuration of the display device 201 eliminates the need to fill the openings 81 with a light-transmissive resin, after the semiconductor light-emitting device is mounted. Accordingly, the manufacturing process of the display device 201 can be simplified and the manufacturing cost thereof can also be reduced.

Further, it is not necessary to connect a wire to the semiconductor light-emitting device 101. Therefore, there is no need to insert a capillary for bonding a wire in the opening 81. In addition, it is not necessary to insert a device, such as a nozzle, for filling the opening 81 with a light-transmissive resin. Thus, the opening 81 can be small as long as it accommodates the semiconductor light-emitting device 101 therein. In addition to the above, the semiconductor light-emitting device 101 is formed in a relatively small size as already described, and hence the footprint can be reduced when mounted on another device. Consequently, the display device 201 can be manufactured in a smaller size.

Figure 15:
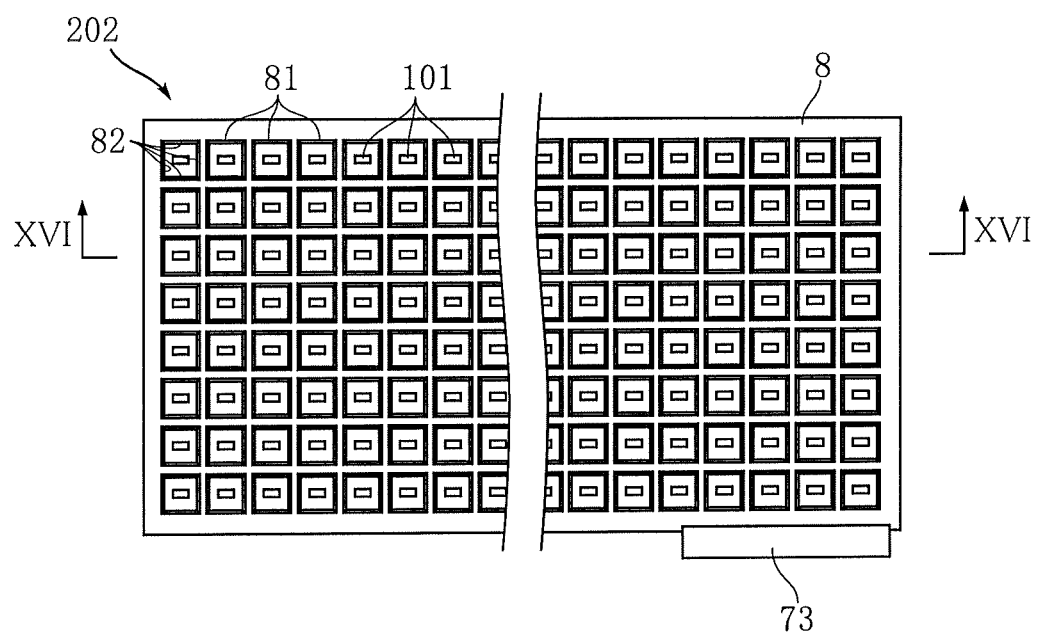
FIG. 15 is a fragmentary plan view of another example of a display device including the semiconductor light-emitting device according to the present invention.
Figure 16:
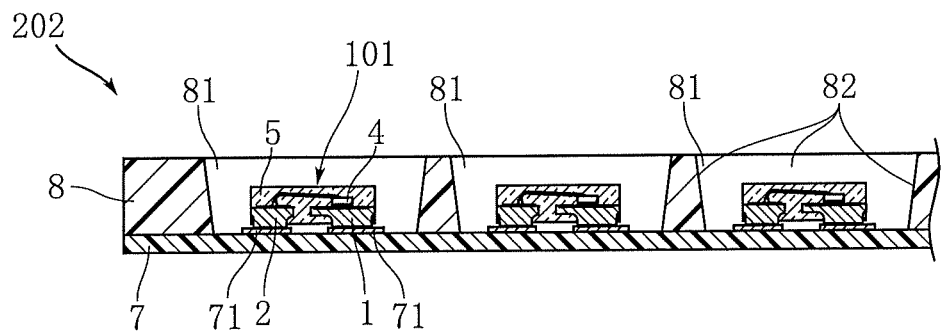
FIG. 16 is a fragmentary cross-sectional view taken along a line XVI-XVI in FIG. 15.
Figure 17:
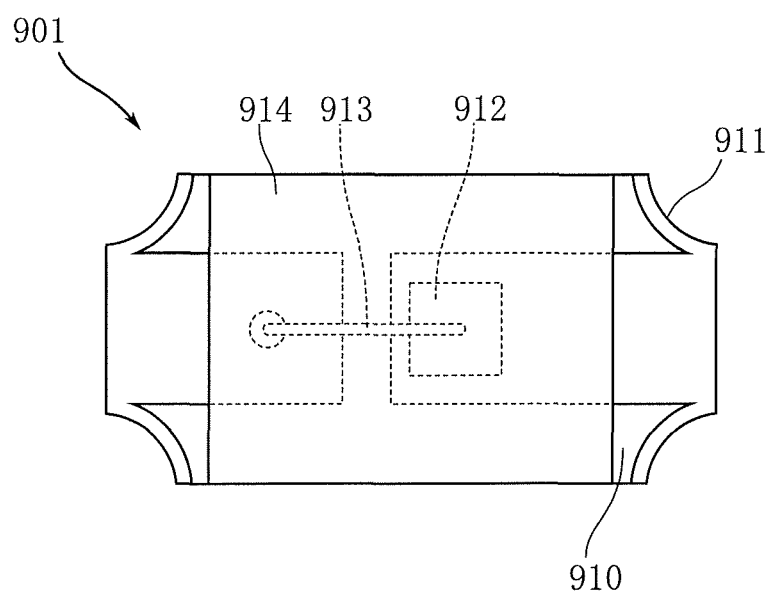
FIG. 17 is a plan view showing an example of a conventional semiconductor light-emitting device.
Figure 18:
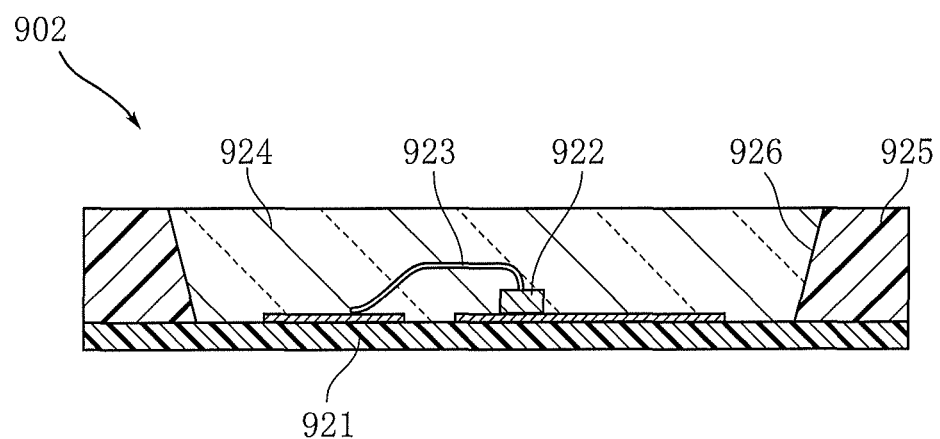
FIG. 18 is a cross-sectional view showing an example of a conventional display device.

FIGS. 15 and 16 depict another example of the display device according to the present invention. The display device 202 according to this embodiment is different from the foregoing embodiment in that the dot matrix type display is adopted.

In the display device 202, the reflector 8 includes a multitude of openings 81. These openings 81 are arranged in a matrix pattern in a plan view. Each of the openings 81 may have, for example, a square shape in a plan view. Each of the openings 81 includes the semiconductor light-emitting device 101. In other words, the display device 202 includes a multitude of semiconductor light-emitting devices 101 mounted on the printed circuit board 7 in a matrix pattern.

The display device 202 can also be manufactured in a smaller size and the manufacturing cost thereof can be reduced. In particular, since the openings 81 can be formed in a smaller size, the multitude of openings 81 can be arranged in a high density. Therefore, the display device 202 can provide a higher-definition display.

The display device including the semiconductor light-emitting device according to the present invention is not limited to the foregoing embodiments. Specific configurations of the constituents of the display device including the semiconductor light-emitting device according to the present invention may be modified in various manners.

In place of the semiconductor light-emitting device 101, the semiconductor light-emitting device 102 may be employed as the light source of the display devices 201, 202.

The invention claimed is:

1. A semiconductor light-emitting device comprising:
a semiconductor light-emitting element;
a first lead including a first main surface;
a plated layer covering a part of the first main surface; and
a resin package covering the semiconductor light-emitting element;
wherein the plated layer has a roughened portion, the first main surface and the resin package are held in contact with each other,
the semiconductor light-emitting element is mounted on the roughened portion of the plated layer, and
the first main surface has an exposed portion uncovered by the plated layer, and the roughened portion of the plated layer is higher in surface roughness than the exposed portion of the first main surface,
wherein the first lead having a first buried surface and a second buried surface corresponds to scrapped portions of the first lead, wherein the first buried surface and the second buried surface are curved and covered by the resin package, and
wherein a bottom surface of the resin package is located opposite the first main surface, and the bottom surface is in contact with ends of the first and second buried surfaces that are curved and a portion of the first lead located between the bottom surface of the resin package and a top surface of a printed circuit board and the portion is exposed from the resin package.

2. The semiconductor light-emitting device according to claim 1, wherein the plated layer is an Ag-plated layer.

3. The semiconductor light-emitting device according to claim 1, wherein the first lead includes a first mounting terminal face located on a side opposite to the first main surface and exposed from the resin package.

4. The semiconductor light-emitting device according to claim 3, wherein the first lead includes a plurality of first side faces extending in a direction in which the first main surface and the first mounting terminal face are separated from each other, and at least a part of each of the first side faces is covered with the resin package.

5. The semiconductor light-emitting device according to claim 4, wherein the first lead includes a first drawn-out portion extending from one of the first side faces and provided with a leading end face exposed from the resin package.

6. The semiconductor light-emitting device according to claim 3, wherein the first buried surface is oriented in the same direction as the first mounting terminal face and covered with the resin package.

7. The semiconductor light-emitting device according to claim 1, further comprising: a wire including a first end portion connected to the semiconductor light-emitting element; and a second lead including a second main surface to which a second end portion of the wire is connected, wherein the second main surface has a roughened portion.

8. The semiconductor light-emitting device according to claim 7, wherein the second main surface includes a plated layer that has the roughened portion.

9. The semiconductor light-emitting device according to claim 7, wherein the second lead includes a second mounting terminal face located on a side opposite to the second main surface and exposed from the resin package.

10. The semiconductor light-emitting device according to claim 9, wherein the second lead includes a plurality of second side faces extending in a direction in which the second main surface and the second mounting terminal face are separated from each other, and at least a part of each of the second side faces is covered with the resin package.

11. The semiconductor light-emitting device according to claim 10, wherein the second lead includes a second drawn-out portion extending from one of the second side faces and provided with a leading end face exposed from the resin package.

12. The semiconductor light-emitting device according to claim 9, wherein the second lead includes a second buried surface oriented in the same direction as the second mounting terminal face and covered with the resin package.

13. The semiconductor light-emitting device according to claim 1, wherein the resin package includes a fluorescent material that emits, upon being excited by light from the semiconductor light-emitting element, light of a wavelength different from a wavelength of the light from the semiconductor light-emitting element.

14. The semiconductor light-emitting device according to claim 1, wherein the resin package includes: a transparent portion that transmits light from the semiconductor light-emitting element, the transparent portion covering the semiconductor light-emitting element; and an opaque portion located on the side opposite to the direction in which the first main surface is oriented to the transparent portion.

15. The semiconductor light-emitting device according to claim 14, wherein the opaque portion is formed of a white resin.

16. The semiconductor light-emitting device according to claim 14, wherein the transparent portion includes a fluorescent material that emits, upon being excited by light from the semiconductor light-emitting element, light of a wavelength different from a wavelength of the light from the semiconductor light-emitting element.

17. A display device comprising:
at least one semiconductor light-emitting device according to claim 1;
a base material including a mounting face on which the semiconductor light-emitting device is mounted; and
a reflector including at least one pair of reflecting surfaces opposing each other with the semiconductor light-emitting device therebetween.

18. The display device according to claim 17, wherein the reflecting surfaces are inclined so as to increase a distance therebetween as proceeding away from the mounting face in a normal direction of the mounting face.

19. The display device according to claim 17, constituted as a 7-segment display device, wherein the reflector is of a plate shape stacked on the base material and includes seven linear openings arranged to form a numeral 8, the openings each penetrating through the reflector in a thickness direction,
the openings each include one semiconductor light-emitting device, and
each of the openings includes an inner surface constituting the reflecting surface.

20. The display device according to claim 17, constituted as a dot matrix display device, wherein the reflector is of a plate shape stacked on the base material and includes a plurality of openings arranged in a matrix pattern, the openings each penetrating through the reflector in a thickness direction,
the openings each include one semiconductor light-emitting device, and
each of the openings includes an inner surface constituting the reflecting surface.

21. The display device according to claim 17, wherein the reflector is formed of a white resin.

22. The display device according to claim 17, wherein the base material is a printed circuit board.

* * * * *